(12) United States Patent
Iwakura

(10) Patent No.: US 10,027,381 B2
(45) Date of Patent: Jul. 17, 2018

(54) METHOD AND APPARATUS FOR INDUCTIVE COUPLING SIGNAL TRANSMISSION

(71) Applicant: Micron Technology, Inc., Boise, ID (US)

(72) Inventor: Ken Iwakura, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/221,346

(22) Filed: Jul. 27, 2016

(65) Prior Publication Data
US 2018/0034514 A1   Feb. 1, 2018

(51) Int. Cl.
*H04B 5/00*  (2006.01)
*H01L 49/02*  (2006.01)
*H01L 25/11*  (2006.01)

(52) U.S. Cl.
CPC .......... *H04B 5/0093* (2013.01); *H01L 25/117* (2013.01); *H01L 28/10* (2013.01)

(58) Field of Classification Search
CPC ...... H04B 5/0093; H01L 25/117; H01L 28/10
USPC ........................................................ 455/41.1
See application file for complete search history.

(56) References Cited

U.S. PATENT DOCUMENTS 7,545,059 B2 * 6/2009 Chen .................. H01F 17/0006
                                                        307/412
9,014,295 B1 * 4/2015 Cronie ................ H04L 25/4925
                                                        375/289
2011/0201271 A1 * 8/2011 Kuroda .............. G01R 31/3025
                                                        455/41.1
2012/0319912 A1 * 12/2012 Taguchi ........... G06K 19/07345
                                                        343/788
2013/0117477 A1 * 5/2013 Kim .................... H04L 25/4906
                                                        710/71
2013/0143490 A1 * 6/2013 Kim ...................... H04B 5/0081
                                                        455/41.1

(Continued)

OTHER PUBLICATIONS

Kuroda, et al., "Perspective of Low-Power and High-Speed Wireless Inter-Chip Communication for SiP Integration", Solid-State Device Research Conference, 2006. ESSDERC 2006. Proceeding of the 36th European; Sep. 19-21, 2006; pp. 3-6.

*Primary Examiner* — Edward Urban
*Assistant Examiner* — Ralph H Justus
(74) *Attorney, Agent, or Firm* — Dorsey & Whitney LLP

(57) ABSTRACT

Method and Apparatuses for of transmitting data between semiconductor chips are described. An example apparatus includes a first semiconductor chip and a second semiconductor chip. The first semiconductor chip includes first and second inductors. The first semiconductor chip transmits a first combination of a plurality of data bits in logical value by flowing a first current through the first inductor and by flowing substantially no current through the second inductor. The second semiconductor chip includes third and fourth inductors that correspond respectively to the first and second inductors of the first semiconductor chip. The second semiconductor chip receives the first combination of the plurality of data bits in logical value by detecting an electromotive force at the third inductor responsive to the first current and by detecting substantially no electromotive force at the fourth inductor responsive to no current.

11 Claims, 13 Drawing Sheets

(56) References Cited

U.S. PATENT DOCUMENTS

| | | | |
|---|---|---|---|
| 2015/0035374 A1* | 2/2015 | Park | H04B 5/0037 307/104 |
| 2015/0084972 A1* | 3/2015 | Wu | G09G 3/2096 345/520 |
| 2015/0171934 A1* | 6/2015 | Brauchler | H01L 29/7393 455/41.1 |
| 2015/0207541 A1* | 7/2015 | Kuroda | H05K 1/0239 455/41.1 |
| 2016/0156390 A1* | 6/2016 | Kuroda | H01L 23/5227 455/41.1 |

* cited by examiner

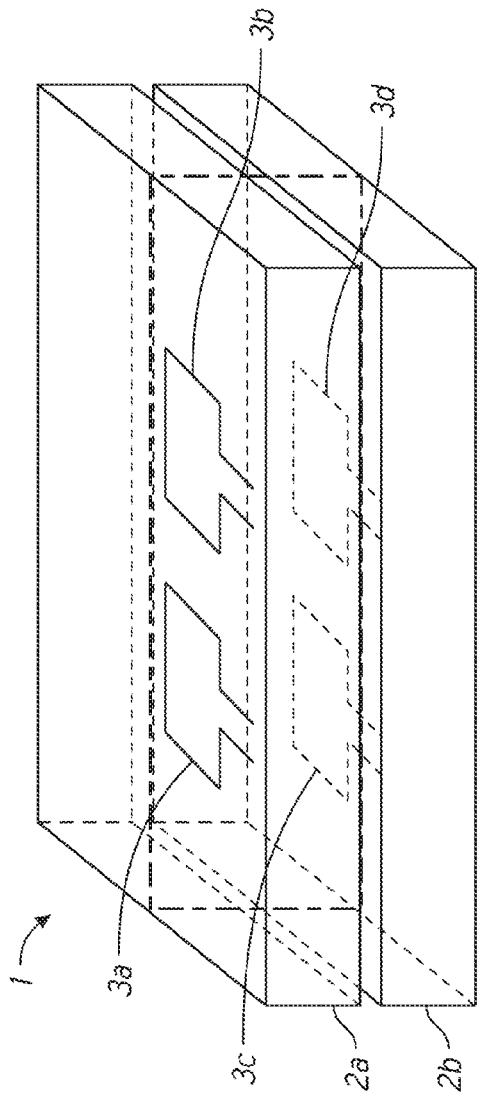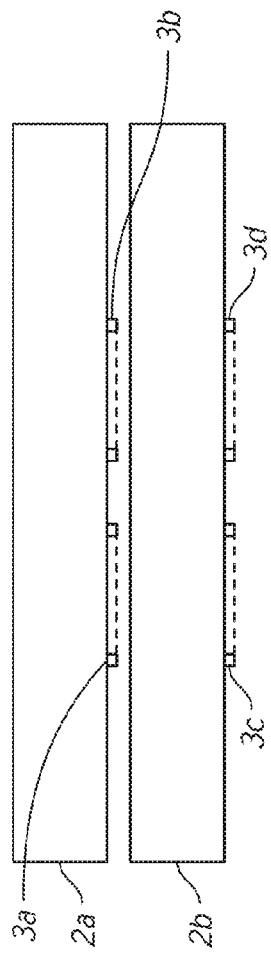
FIG. 1A
FIG. 1B

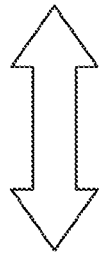

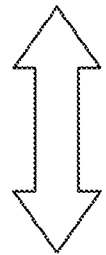

METHOD AND APPARATUS FOR INDUCTIVE COUPLING SIGNAL TRANSMISSION

BACKGROUND

High data reliability, high speed of memory access, lower power consumption and reduced chip size are features that are demanded from semiconductor memory. In recent years, three-dimensional (3D) memory devices by stacking chips vertically stacked have been introduced. Benefits of the 3D memory devices include a plurality of core chips stacked with an interface chip and the memory controller, which allow wide bandwidth buses with high transfer rates between functional blocks in the plurality of core chips and the interface chip, and a considerably smaller footprint. Thus, the 3D memory devices contribute to large memory capacity, higher memory access speed and chip size reduction. The 3D memory devices include Hybrid Memory Cube (HMC) and High Bandwidth Memory (HBM).

As for inter-chip interconnections among stacked chips in a package, there are two types: wired interconnections; and wireless inter connections. As for wired interconnections, for example, microbumps for two chips or through silicon vias for two or more chips may be used. As for wireless interconnections, for example, capacitive coupling for two chips or inductive coupling for two or more chips may be employed. Recent proximity wireless communication technology exhibits about the same level of performance as wired link technology. For example, the proximity wireless communication technology may be comparable with the wired link technology in terms of data rates, reliability, power consumption, size, and connections.

To facilitate inductive coupling with coils, each chip of a plurality of chips stacked on a substrate or an interposer has coils, and data transmission between chips may be performed by inductive coupling. FIG. 1A is a schematic diagram of inductive coupling between two semiconductor chips in a semiconductor device. FIG. 1B is a cross-sectional schematic diagram of inductive coupling between the two semiconductor chips in the semiconductor device. For example, the semiconductor device 1 may include two semiconductor chips 2a and 2b. For example, the semiconductor chip 2a may be stacked on the semiconductor chip 2b. The semiconductor chip 2a may include a plurality of transmitter coils 3a and 3b attached at one face of (e.g., a bottom face) of the semiconductor chip 2a. The semiconductor chip 2b may include a plurality of receiver coils 3c and 3d attached at one face of (e.g., a bottom face) of the semiconductor chip 2b.

FIG. 2A is a simplified schematic diagram of the plurality of coils 3a to 3d in FIGS. 1A and 1B. Each of the transmitter coils 3a and 3b may flow an electric current responsive to a signal to be transmitted. For example, as shown in FIG. 2A, the transmitter coil 3a may flow a current in a first direction (e.g., the counterclockwise direction) responsive to a signal having a logic low level (e.g., "0", a falling edge). The transmitter coil 3b may flow a current in a second direction opposite to the first direction (e.g., the clockwise direction) responsive to a signal having a logic high level (e.g., "1", a rising edge). Due to the currents of the transmitter coils 3a and 3b, electromotive forces may be induced at the receiver coils 3c and 3d. The receiver coils 3c and 3d may replicate signals having the same logic level (e.g., "0" and "1", respectively) as the transmitter coils 3a and 3b due to the electromotive forces. FIG. 2B is a data combination table showing possible sets of combinations of two bit data for transmission in FIG. 2A. Bit1 and Bit2 may be either the logic low level ("0") or the logic high level ("1"). Thus there may be four combinations of possible two bit data patterns which may be expressed.

BRIEF DESCRIPTION OF THE DRAWINGS

FIG. 1A is a schematic diagram of inductive coupling between two semiconductor chips.

FIG. 1B is a cross-sectional schematic diagram of inductive coupling between the two semiconductor chips.

FIG. 5A is a data combination table showing possible sets of combinations of four bit data transmission according to an embodiment of the present disclosure.

FIG. 5B is a data combination table showing possible sets of combinations of states of three inductors for the four bit data transmission in FIG. 5A.

FIG. 7A is a data combination table showing possible sets of combinations of four bit data transmission according to an embodiment of the present disclosure.

FIG. 7B is a data combination table showing possible sets of combinations of states of four inductors for the four bit data transmission in FIG. 7A.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice, the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figures 2A, 2B:
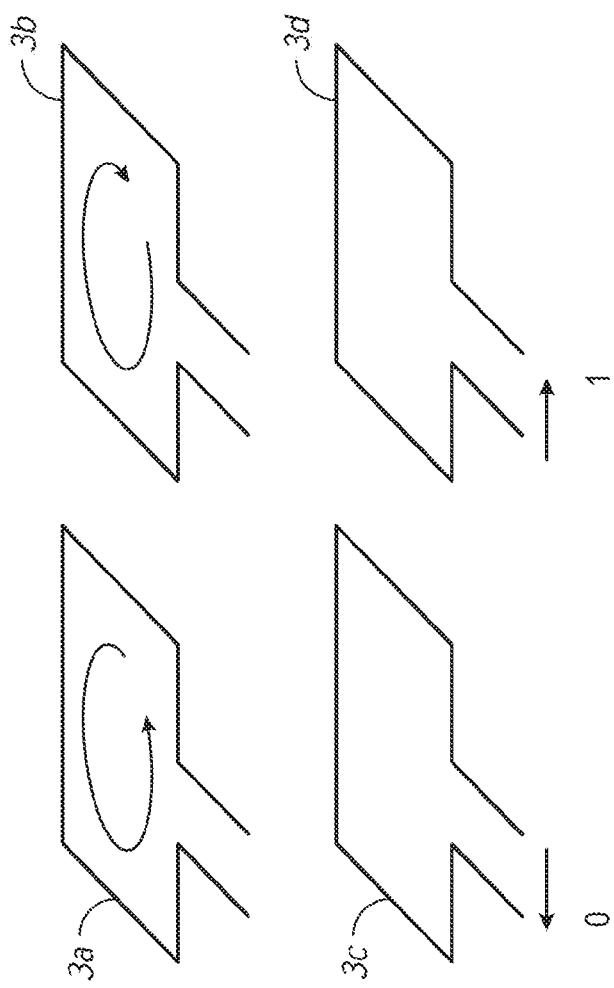
FIG. 2A is a simplified schematic diagram of the plurality of coils in FIGS. 1A and 1B.
FIG. 2B is a data combination table showing possible sets of combinations of two bit data for transmission in FIG. 2A.
Figure 3A:
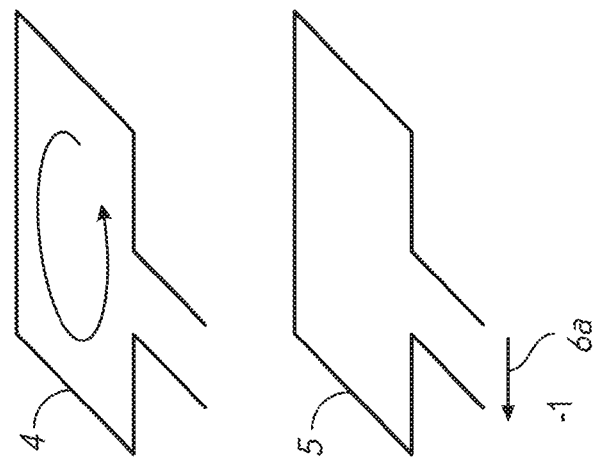
FIGS. 3A to 3C are simplified schematic diagrams of a plurality of inductors of inductive coupling between two semiconductor chips according to an embodiment of the present disclosure.
Figure 3B:
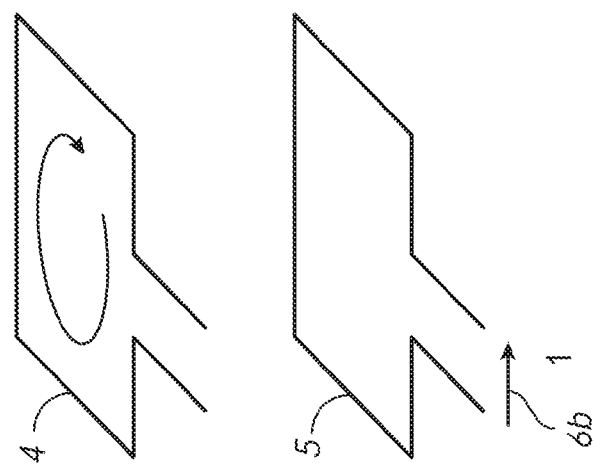
Figure 3C:
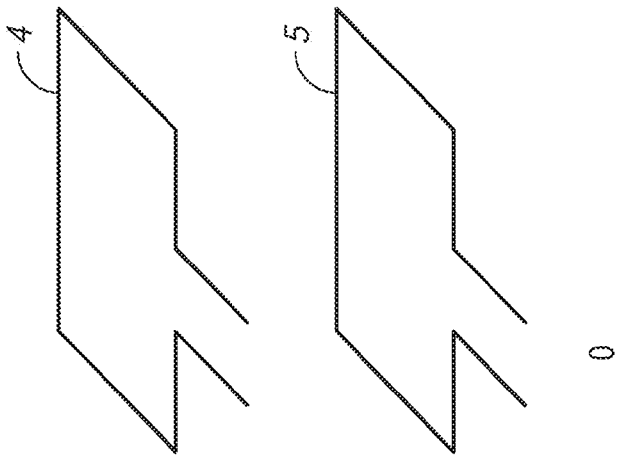

FIGS. 3A to 3C are simplified schematic diagrams of two inductors 4 and 5 in three states of inductive coupling between two semiconductor chips according to an embodiment of the present disclosure. Each of the inductor 4, 5 may be a coil, however, any inductor which may have ability to induce a magnetic field may be used. For example, FIG. 3A shows a first state in which the inductor 4 may be in a state of flowing (e.g., increasing) a current in a first direction (e.g., the counterclockwise direction) which induces an electromotive force in an inductor 5 to replicate a signal "−1". FIG. 3B shows a second state in which the inductor 4 may be in a state of flowing (e.g., increasing) a current in a second direction opposite to the first direction (e.g., the clockwise direction) which induces an electromotive force in an inductor 5 to replicate a signal "1". FIG. 3C shows a third state in which the inductor 4 may be in a state of suppressing a current to a substantially zero level (e.g., flowing no current or suppressing a change in the flowing current) which induces substantially no electromotive force in an inductor 5, thus the inductor 5 may replicate a signal "0".

Figures 4A, 4B:
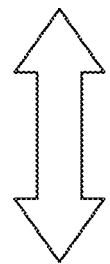
FIG. 4A is a data combination table showing possible sets of combinations of three bit data transmission in FIG. 3.
FIG. 4B is a data combination table showing possible sets of combinations of states of two inductors for the three bit data transmission in FIG. 4A.

FIG. 4A is a data combination table showing possible sets of combinations of three bit data transmission. FIG. 4B is a data combination table showing possible sets of combinations of states in FIGS. 3A to 3C of two inductors for the three bit data transmission in FIG. 4A. The possible sets of combination or states of two inductors for the three bit data transmission in FIG. 4A are merely examples and other sets of combination may be possible. Each combination of three data bits (Bit1, Bit2 and Bit3) may be encoded in to a respective combination of three states of the two inductors (IND1 and IND2). When performing signal transmission with inductive coupling in FIG. 3A, the inductor 4 may be in a first current state represented by a current change in a first direction (e.g., flowing an increasing current in the first direction). The increasing current may induce an electromotive force, shown as an arrow 6a pointing a third direction, in the inductor 5. When performing signal transmission with inductive coupling in FIG. 3B, the inductor 4 may be in a second current state represented by a current change in a second direction (e.g., flowing an increasing current in the second direction). The increasing current may induce an electromotive force, shown as an arrow 6b pointing a fourth direction opposite to the third direction, in the inductor 5. Furthermore, there is no electromotive force induced in the inductor 5, if the inductor 4 is in a third current state represented by no current change as shown in FIG. 3C (e.g., there is no current or a constant current in the inductor 4).

For example, a state of inducing the electromotive force 6a in the third direction of the inductor 5 due to the first current state (the increasing current in the first direction) of the inductor 4 may be expressed as "−1". A state of inducing the electromotive force 6b in the fourth direction of the inductor 5 due to the second current state (the increasing current in the second direction) of the inductor 4 may be expressed as "1". A state that no electromotive force is induced in the inductor 5 due to the third current state may be expressed as "0". A pair of inductors (IND1, IND2) may express three values as shown in FIG. 4A corresponding to FIG. 4B by controlling current states of the pair of inductors based on bit data. For example, the inductors IND1 and IND2, having electromotive forces in the third direction (−1, −1) may represent three bit data "000". The inductors IND1 and IND2, having electromotive forces in the third direction and the fourth direction respectively (−1, 1) may represent three bit data "010". Two pairs of inductors may express nine ($=3^2$) values, which may be able to inclusively associate with three bit binary data having eight ($=2^3$) variations. Thus, three bit data as shown in FIG. 4A may be expressed as two inductors states for transmission. As described above, the three bit data can be transmitted by two pairs of inductors. This results in fewer inductors on the chip surface, and thus lower power consumption and more spaces on the chip surface.

FIG. 5A is a data combination table showing possible sets of combinations of four bit data transmission according to an embodiment of the present disclosure. FIG. 5B is a data combination table showing possible sets of combinations of states of three inductors for the four bit data transmission in FIG. 5A. Description of components corresponding to components included in FIGS. 3, 4A and 4B will not be repeated and changes from FIGS. 4A and 4B, including configuration of a plurality pairs of inductors will be described. The possible sets of combination of states of three inductors for the four bit date transmission in FIGS. 5A and 5B are merely examples and other sets of combination may be possible. Each combination of four data bits (Bit1, Bit2, Bit3 and Bit4) may be encoded in to a respective combination of three states of the three inductors (IND1, IND2 and IND3).

For example, the inductors IND1, IND2 and IND3, having electromotive forces in the third direction (−1, −1, −1) may represent four bit data "1000". The inductors IND1, IND2 and IND3, having an electromotive force in the third direction, no electromotive force, and an electromotive force in the fourth direction respectively (−1, 0, 1) may represent three bit data "1111". Three pairs of inductors may express twenty-seven ($=3^3$) values, which may be able to inclusively associate with four bit binary data having sixteen ($=2^4$) variations. Thus, four bit data as shown in FIG. 5A may be expressed as three inductors states for transmission. As described above, Nbit data of $2^N$ values can be transmitted by at most N−1 pairs of inductors which may express ($3^{N-1}$) values wherein N is equal or greater than three (N≥3). For example, X (=3n; n is a natural number) bit data may be transmitted by 2N pairs of inductors. In inductive coupling transmission, inductors such as coils may use tri-state transmission due to three states available for the inductors, such as the electromotive force in the inductor is in the third direction, in the fourth direction, or no electromotive force induced. This tri-state transmission may result in fewer inductors on the chip surface, and thus lower power consumption and more spaces on the chip surface.

Figures 6A, 6B:
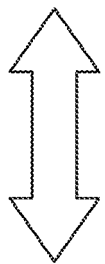
FIG. 6A is a data combination table showing possible sets of combinations of two bit data transmission in FIG. 3.
FIG. 6B is a data combination table showing possible sets of combinations of states of two inductors for the two bit data transmission in FIG. 6A.

In signal transmission with inductive coupling, transmission errors may be caused by interference (noise) between adjacent inductors. Especially, an electromotive force at a receiver side may be deteriorated when adjacent inductors operate in opposite phases to each other because of a greater leakage of magnetic fields becomes greater. FIG. 6A is a data combination table showing possible sets of combinations of two bit data transmission. FIG. 6B is a data combination table showing possible sets of combinations of states in FIGS. 3A to 3C of two inductors for the two bit data transmission in FIG. 6A. Description of components corresponding to components included in FIG. 3 will not be repeated. The possible sets of combination of states of two inductors for the two bit data transmission in FIG. 6A are merely examples and other sets of combination may be possible. Each combination of two data bits (Bit1 and Bit2) may be encoded in to a respective combination of three states of the two inductors (IND1 and IND2).

For example, a state of inducing the electromotive force 6a in the third direction of the inductor 5 due to the first current state (the increasing current in the first direction) of the inductor 4 may be expressed as "−1". A state of inducing the electromotive force 6b in the fourth direction of the inductor 5 due to the second current state (the increasing current in the second direction) of the inductor 4 may be expressed as "1". A state that no electromotive force is induced in the inductor 5 due to the third current state may be expressed as "0". A pair of inductors may express three values as shown in FIG. 6A corresponding to FIG. 6B. For example, the inductors IND1 and IND2, having electromotive forces in the third direction (−1, −1), may represent two bit data "00". The inductors IND1 and IND2, having no electromotive force and having an electromotive force in the third direction respectively (0, −1), may represent two bit data "01". Two pairs of inductors may express nine (=$3^2$) values, which may be able to inclusively associate with two bit binary data having four (=$2^2$) variations.

Here, it is possible to have some combination of two adjacent inductors states unassigned if the combination of two adjacent inductors states may be undesirable due to high likeliness of the interference. For example, the data combination table of FIG. 6B shows that combinations of the two adjacent inductors IND1 and IND2 states, other than the combinations of (−1, 1) or (1, −1), are assigned by using three states ("1", "−1" or "0") of the two adjacent inductors IND1 and IND2 for any bit data combination in FIG. 8A. In the other words, a semiconductor chip including adjacent inductors IND1 and IND2 may prohibit flowing a first current through the inductor IND1 in the first direction and flowing a second current through the inductor IND2 in the second direction opposite to the first direction simultaneously. As described above, the two bit data may be transmitted by two adjacent pairs of inductors excluding the combinations of "−1, 1" or "1, −1" at the two adjacent inductors. This phase assignment results in preventing from generating magnetic fields of opposite phases by the adjacent inductor and further from deterioration of adjacent electromotive forces induced in adjacent inductors, without considerable modification of peripheral circuitry around the inductors on the chip surface.

FIG. 7A is a data combination table showing possible sets of combinations of four bit data transmission according to an embodiment of the present disclosure. FIG. 7B is a data combination table showing possible sets of combinations of states in FIGS. 3A to 3C of four inductors for the four bit data transmission in FIG. 7A. Description of components corresponding to components included in FIGS. 3A to 3C, 6A and 6B will not be repeated and changes from FIGS. 6A and 6B, including configuration of a plurality pairs of inductors will be described. The possible sets of combination of states of four inductors for the four bit data transmission in FIGS. 7A and 7B are merely examples and other sets of combination may be possible each combination of four data bits (Bit1, Bit2, Bit3 and Bit4) may be encoded in to a respective combination of three states of the four inductors (IND1, IND2, IND3 and IND4).

For example, four inductors of three states in FIGS. 3A to 3C, having an electromotive force with a fourth direction, and no electromotive force for three adjacent inductors, expressed by (1, 0, 0, 0), may represent four bit data "0000". The four inductors, having an electromotive force in the third direction, no electromotive force for three adjacent inductors expressed by (−1, 0, 0, 0) may represent four bit data "1111". Four pairs of inductors may express eighty-one (=$3^4$) values, which may be able to inclusively associate with four bit binary data having sixteen (=$2^4$) variations. Thus, four bit data as shown in FIG. 7A may be expressed as four inductors states for transmission. This allows a semiconductor chip to adopt combinations of the two adjacent inductors states, other than the combinations of (−1, 1) or (1, −1) by using three states ("1", "−1" or "0") of the two adjacent inductors for any bit data combination in FIG. 7A.

In a case of four inductors, a combination excluding a combination of adjacent four inductors in opposite phases, (e.g., combinations expressed by (−1, 1) or (1, −1)) may be selected. In a case of N inductors (where N is a natural number), the number of combinations where one inductor among N inductors having the "1" state and the other inductors having the "0" state may be represented by $_NC_1$. Similarly, the number of combinations where two inductor among N inductors having the "1" state and the other inductors having "0" states may be represented by $_NC_2$. The number of states which is represented by "1" and "0" may be expressed as:

$$\Sigma_{i=0}^{N} {_NC_i} = 2^N - 1.$$

The number of states which may be represented by "−1" and "0" is the same. The total of $2(2^N-1)=2^{N+1}-2$ states may be represented by N inductors having combinations of "1" and "0" or combinations of "−1" and 0. As $2^{N+1}-2$ is greater than $2^N$ is greater than 1 (N>1), it is possible to transmit N bit data by N pairs of inductors, without adjacent inductors in opposite phases to each other.

In inductive coupling transmission, inductors such as coils may use tri-state transmission due to three states available for the inductors, such as the electromotive force in the inductor is in the third direction, in the fourth direction, or no electromotive force induced. This tri-state transmission may result in preventing adjacent inductors on the chip surface to have opposite phases, and low noise transmissions with less interference between the adjacent inductors.

Figure 8:
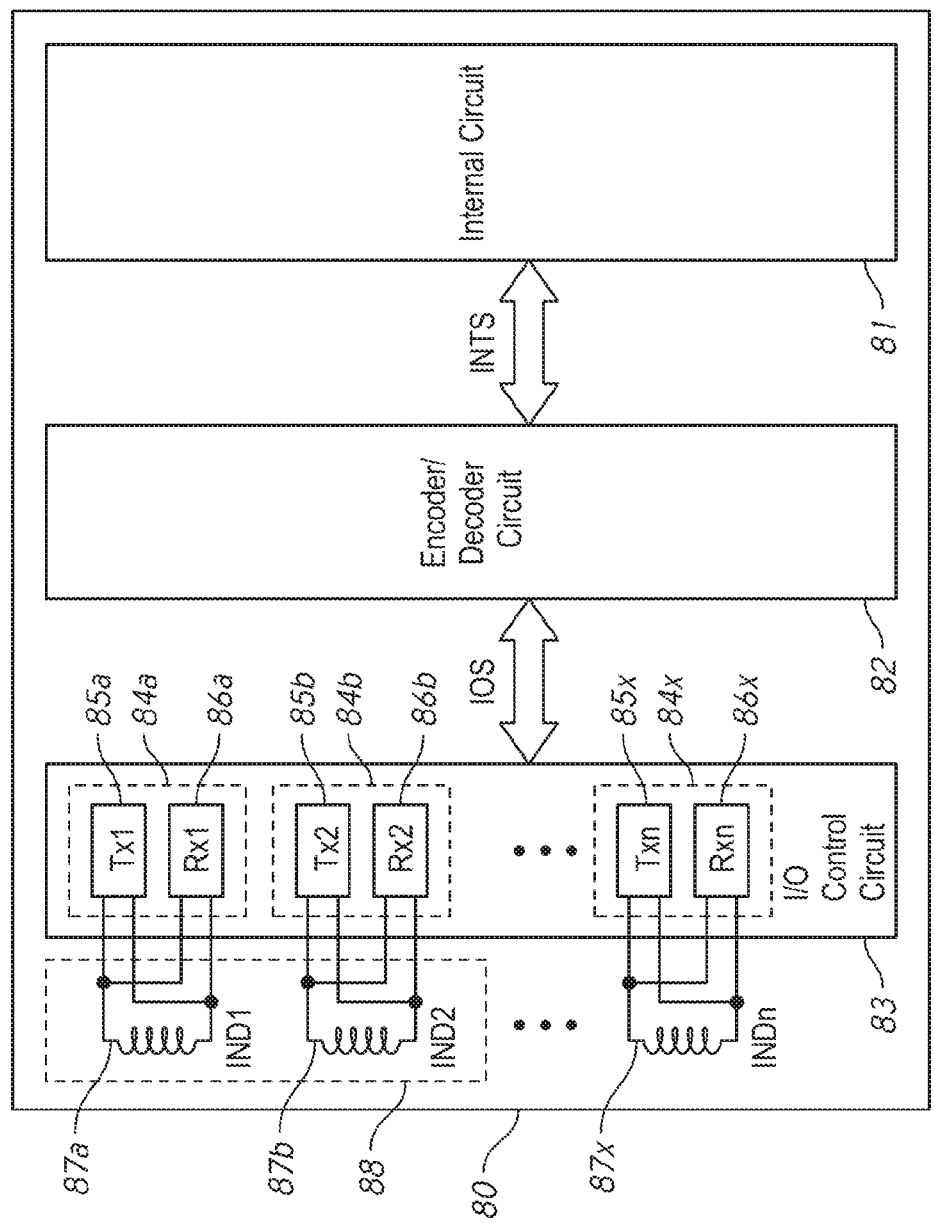
FIG. 8 is a block diagram of a semiconductor chip including a plurality of inductors, according to an embodiment of the present disclosure.

FIG. 8 is a block diagram of a semiconductor chip 80 including a plurality of inductors, according to an embodiment of the present disclosure. The semiconductor chip 80 may be used to implement the semiconductor chip 2a and the semiconductor chip 2b in FIG. 1 in some embodiments. The semiconductor chip 80 may include an internal circuit 81, an encoder/decoder circuit 82, an input/output (I/O) control circuit 83 and a plurality of inductors IND1 87a to INDn 87x, where "n" is a number of the plurality of inductors IND1 87a to INDn 87x. Internal signals INTS may be transmitted between the internal circuit 81 and the encoder/decoder circuit 82. The internal signals INTS may include a plurality of combinations of data bits. The encoder/decoder circuit 82 may encode the internal signals INTS into the I/O signals IOS. Alternatively, the encoder/decoder circuit 82 may decode the I/O signals IOS into the internal signals INTS. The above encoding and decoding may be executed based on a set of data translation tables, such as FIGS. 4A and 4B, FIGS. 5A and 5B, FIGS. 6A and 6B, or FIGS. 7A and 7B. Input/output (I/O) signals IOS may be transmitted between the encoder/decoder circuit 82 and the I/O control circuit 83, which may include a plurality of converters 84a to 84x. Each of the plurality of converters 84a to 84x may include a combination of a transmitter circuit 85 and a receiver circuit 86. For example, the converter 84a may include a transmitter circuit 85a and a receiver circuit 86a Rxn. The I/O signals IOS may include a plurality of control signals to control the transceiver circuits Tx0 85a to Txn 85x in order to set states of the inductors IND1 87a to INDn 87x. In other word, the I/O signals IOS may include combinations of inductors states signals responsive to combinations of data bits in the internal signals INTS. The I/O signals IOS further include signals provided from the receiver circuits Rx1 86a to Rxn 86x. In one embodiment, a plurality of adjacent inductors 87 may form group of inductors 88. For example, the inductors IND1 87a and IND2 87b in the group of inductors 88 may be arranged adjacently to each other on the chip. The plurality of adjacent inductors 87 in each group 88 may operate simultaneously to transmit/receive a respective combination of data bits. In some embodiment, the number of inductors in each group may be more than two.

Figure 9:
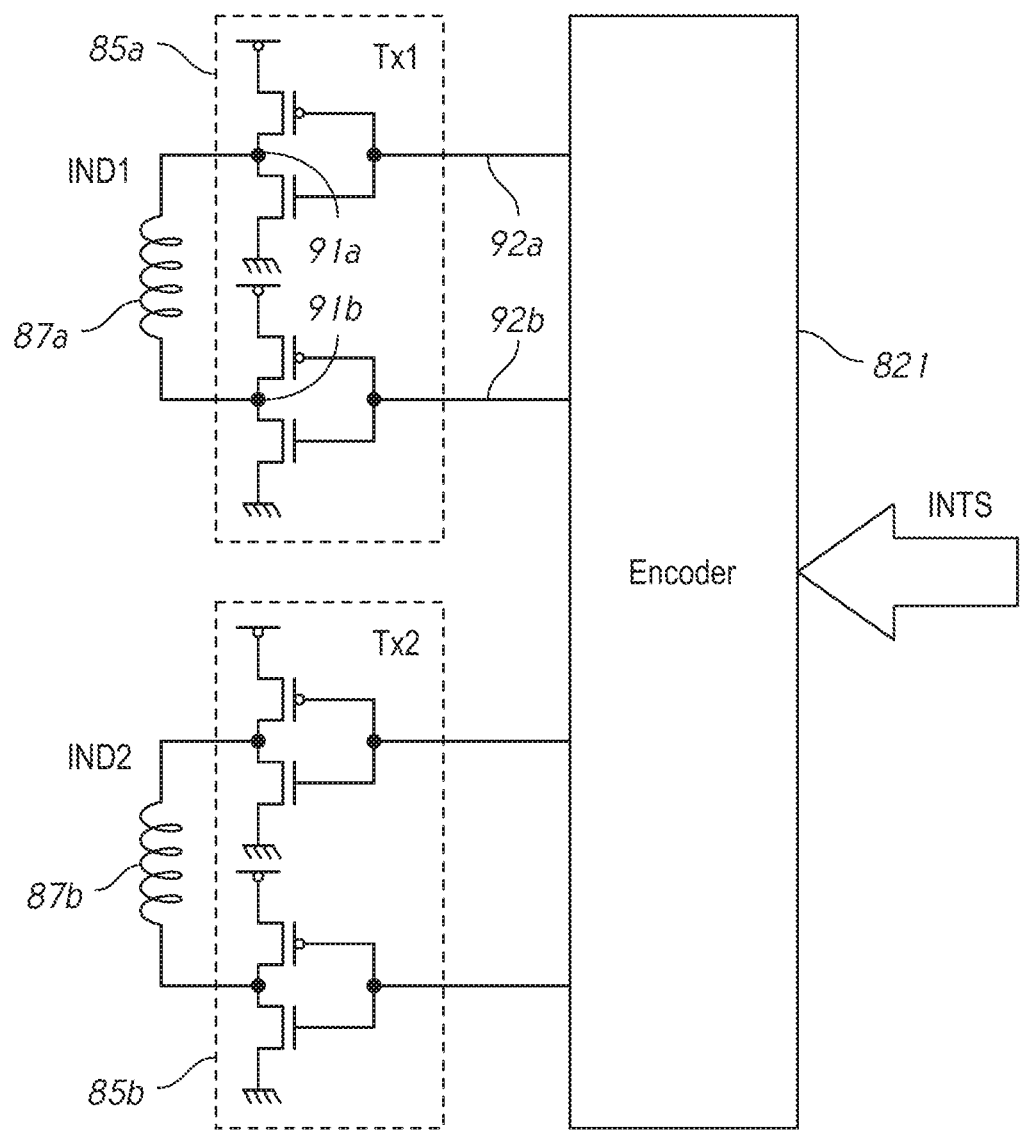
FIG. 9 is a block diagram of a portion of the semiconductor chip including an encoder and the plurality of inductors and the plurality of transmitter circuits in FIG. 8, according to an embodiment of the present disclosure.

FIG. 9 is a block diagram of a portion of the semiconductor chip 80 including an encoder 821, the plurality of inductors IND1 87a and IND2 87b, and the plurality of transmitter circuits 85a and 85b in FIG. 8, according to an embodiment of the present disclosure. The encoder 821 may be included in the encoder/decoder circuit 82. The encoder 821 may encode the internal signal INTS into the I/O signal IOS based on a signal translation table, such as such as FIGS. 4A and 4B, FIGS. 5A and 5B, FIGS. 6A and 6B, or FIGS. 7A and 7B. The encoder 821 may be coupled to the plurality of transmitter circuits Tx1 85a and Tx2 85b via signal lines that convey the I/O signal IOS. For example, the encoder 821 may be coupled to the transmitter circuit Tx1 85a by a pair of signal lines 92a and 92b which conveys a portion of the I/O signals. The encoder 821 may provide one pair of signals on the pair of signal lines 92a and 92b among four possible pairs of signals, each has either a logic high or low signal (e.g., "1" or "0"). Two inductors IND1 87a and IND2 87b may function as transmitters. A particular combination of the pair of signals may cause a current in the inductor IND1 87a to flow or increase in one direction and may further cause a current in the inductor IND2 87b to flow or increase in the other direction which is a reverse direction to the one direction simultaneously. For example, a signal pair (1, 1) on the pair of signal lines 92a and 92b sets a ground level voltage to nodes 91a and 91b at both ends of the inductor IND1 87a. A signal pair (0, 0) on the pair of signal lines 92a and 92b pulls up the nodes 91a and 91b. Thus, there is no voltage difference, which flows results in no current flowing in the inductor IND1 87a responsive to the signal pairs (1, 1) and (0, 0). A signal pair (1, 0) on the pair of signal lines 92a and 92b may set the node 91a to ground level voltage and pull up the node 91b which causes a voltage difference that flows a current on the inductor IND1 87a from the node 91b to the node 91a. On the other hand, a signal pair (0, 1) on the pair of signal lines 92a and 92b may pull up the node 91a and set the node 91b to around level voltage. Thus, there is a voltage difference that flows the current on the inductor IND1 87a from the node 91a to the node 91b. Thus, directions of electromotive forces at the inductors may be controlled based on the internal signal INTS.

Figure 10:
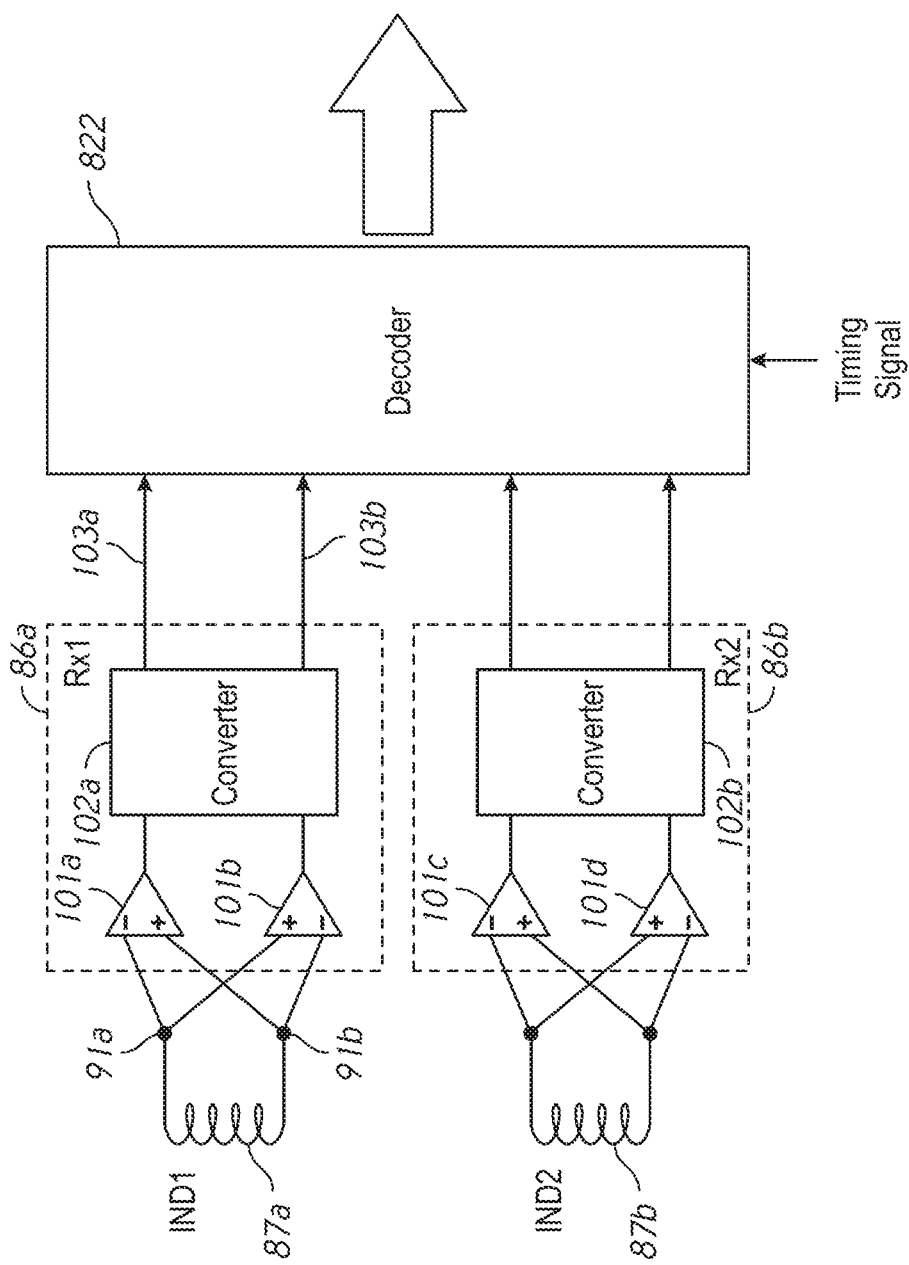
FIG. 10 is a block diagram of a portion of the semiconductor chip including a decoder and the plurality of inductors and the plurality of receiver circuits in FIG. 8, according to an embodiment of the present disclosure.

FIG. 10 is a block diagram of a portion of the semiconductor chip including a decoder 822 and the plurality of inductors IND1 87a and IND2 87b, and the plurality of receiver circuits Rx1 86a and Rx2 86b in FIG. 8, according to an embodiment of the present disclosure. Another pair of inductors (not shown) may induce electromotive forces in the plurality of inductors IND1 87a and IND2 87b. The inductor IND1 87a may be coupled to a pair of input circuits 101a and 101b. For example, a node 91a at one end of the inductor 87a may be coupled to a positive input of the input circuit 101b and further to a negative input of the input circuit 101a. The receiver circuit Rx1 86a includes two input circuits 101a and 101b and a converter 102a. The receiver circuit Rx2 86b includes two input circuits 101c and 101d and a converter 102b. A node 91b at the other end of the inductor IND1 87a may be coupled to a negative input of the input circuit 101b and a positive input of the input circuit 101a. Similarly, the inductor IND2 87b may be coupled to a pair of input circuits 101c and 101d. The pair of input circuits 101a and 101b may provide output signals to the converter 102a. Similarly, the pair of input circuits 101c and 101d may provide output signals to the converter 102b. The converters 102a and 102b may be used to convert a bipolar signal having three states (e.g., "1"; one direction, "0"; no current, and "−1"; the other direction) received by the inductors into a pair of two state unipolar signals (e.g., "1, 0", "0, 1", and "0, 0") on a pair of signal lines. For example, the converter 102b may convert a bipolar signal "1" at the inductor IND1 87a into a pair of signals "1, 0" on a pair of signal lines 103a and 103b to the decoder circuit 822. Similarly, the converter 102b may convert a bipolar signal at the inductor IND2 87b into a pair of signals to the decoder circuit 822. The decoder circuit 822 receives the pairs of signals from the converters 102a and 102b. The decoder circuit 822 may receive a timing signal TS externally, such as a clock signal supplied by a clock generator outside the semiconductor chip 80 or the like. The decoder circuit 822 may latch the received pairs of signals responsive to the timing signal TS. Thus, the decoder 822 may decode the pairs of signals, such as the signals in the I/O signals IOS in FIG. 8, into the internal signals INTS based on a signal translation table, such as FIGS. 4A and 4B, FIGS. 5A and 5B, FIGS. 6A and 6B, or FIGS. 7A and 7B.

Figure 11:
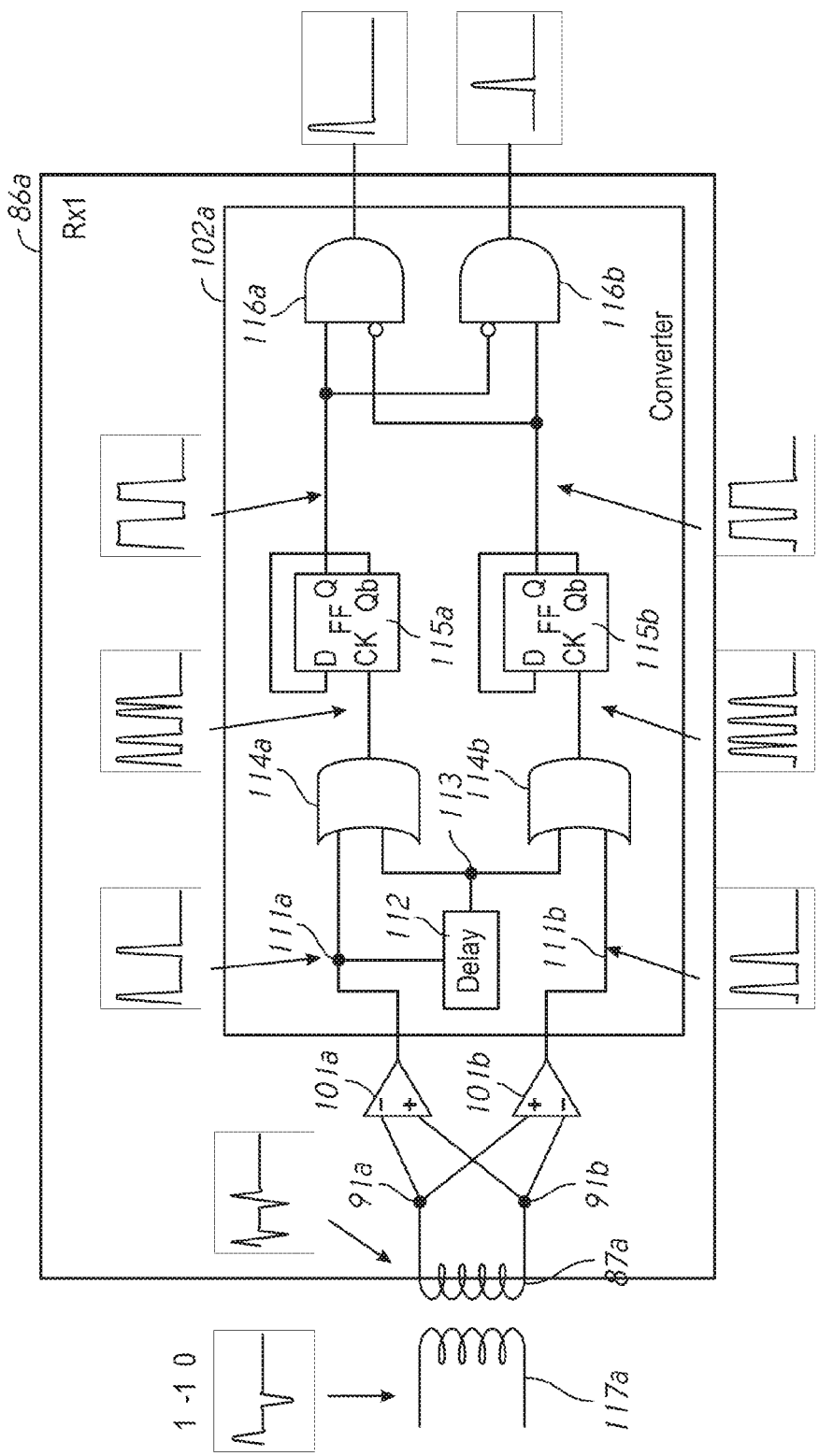
FIG. 11 is a schematic diagram of one of the receiver circuits in FIG. 8, according to an embodiment of the present disclosure.

FIG. 11 is a schematic diagram of one of the receiver circuits in FIG. 8, according to an embodiment of the present disclosure. For example, an inductor 117a outside the receiver circuit 86a transmits a current signaling a signal sequence "1, −1, 0" represented by a sequence of a positive pulse, a negative pulse and no pulse. Due to inductive coupling, the inductor 87a may be induced to have a voltage signal of a positive pulse followed by a negative pulse responsive to an electromotive force induced by a rise and a fall of the positive current pulse signal respectively at the inductor 117a to signal "1". Between signaling "1" and "−1", the current of the inductor 117a becomes 0 which causes a voltage level 0 at the inductor 87a. In signaling the next signal "−1", the inductor 87a may be induced to have a voltage signal of a negative pulse followed by a positive pulse responsive to an electromotive force induced by a fall and a rise of the negative current pulse signal at the inductor 117a to signal "−1". After signaling "−1", the current of the inductor 117a becomes 0 which causes a voltage level 0 at the inductor 87a. Based on the voltage signal, the pair of the input circuits 101a and 101b provides output signals for example, the input circuit 101a may provide positive pulse signals responsive to the positive pulses on the voltage signal on a node 111a. The input circuit 101b may provide pulse signals responsive to the negative pulses on the voltage signal on a node 111b. The voltage signal on the node 11a may be provided to a delay 112 to provide a delayed signal on a node 113a. The signals on the nodes 111a and 113 may be provided to an OR circuit 114a and an output signal of the OR circuit 114a may be provided to a clock input of a flip-flop (FF) 115a. The signals on the node 113 and the node 11b may be provided to an OR circuit 114b and an output signal of the OR circuit 114b may be provided to a clock input of a flip-flop (FF) 115b. The FF 115a provides an output signal from Q output to an AND circuit 116a and receives a complementary output signal Qb output signal at a data input. The FF 115b provides an output signal from Q output to an AND circuit 116b and receives a complementary output signal Qb output signal at a data input. The AND circuit 116a receives the output signal of the FF 115a and an inversed signal of the output signal of the FF 115b and provides a positive pulse signal responsive to the signal "1" at the inductor 117a. The AND circuit 116b receives the output signal of the FF 115b and an inverted signal of the output signal of the FF 115a and provides a positive pulse signal responsive to the signal "−1" at the inductor 117a. As described above, the output signals of the AND circuits 116a and 116b correspond to "1" and "−1" current level of the current signal at the inductor 117a, respectively. The output signals of the AND circuits 116a and 116b become "0" when the current level at the inductor 117a is set to "0". Thus, the output signals of the AND circuits 116a and 116b become "0" when the current level at the inductor 117a is set to "0". As shown in FIGS. 4B and 6B, it is possible to configure a set of states of the inductors IND1 and IND2 not to have a combination of "0, 0". When the two output signals of the converter 102a in the receiver circuit Rx1 86a are "0" indicating that the inductor corresponds to the inductor 87a IND1 is "0" and the two output signals of the converter 102b in the receiver circuit Rx2 86b are "0" indicating that the inductor corresponds to the inductor 87b IND2 is "0", from the signal translation table in FIG. 4B or FIG. 6B, a combination of the two inductor states "0, 0" is not assigned to a data signal. Thus it may be possible to have the combination assigned to signal clock pulse edges.

Figure 12:
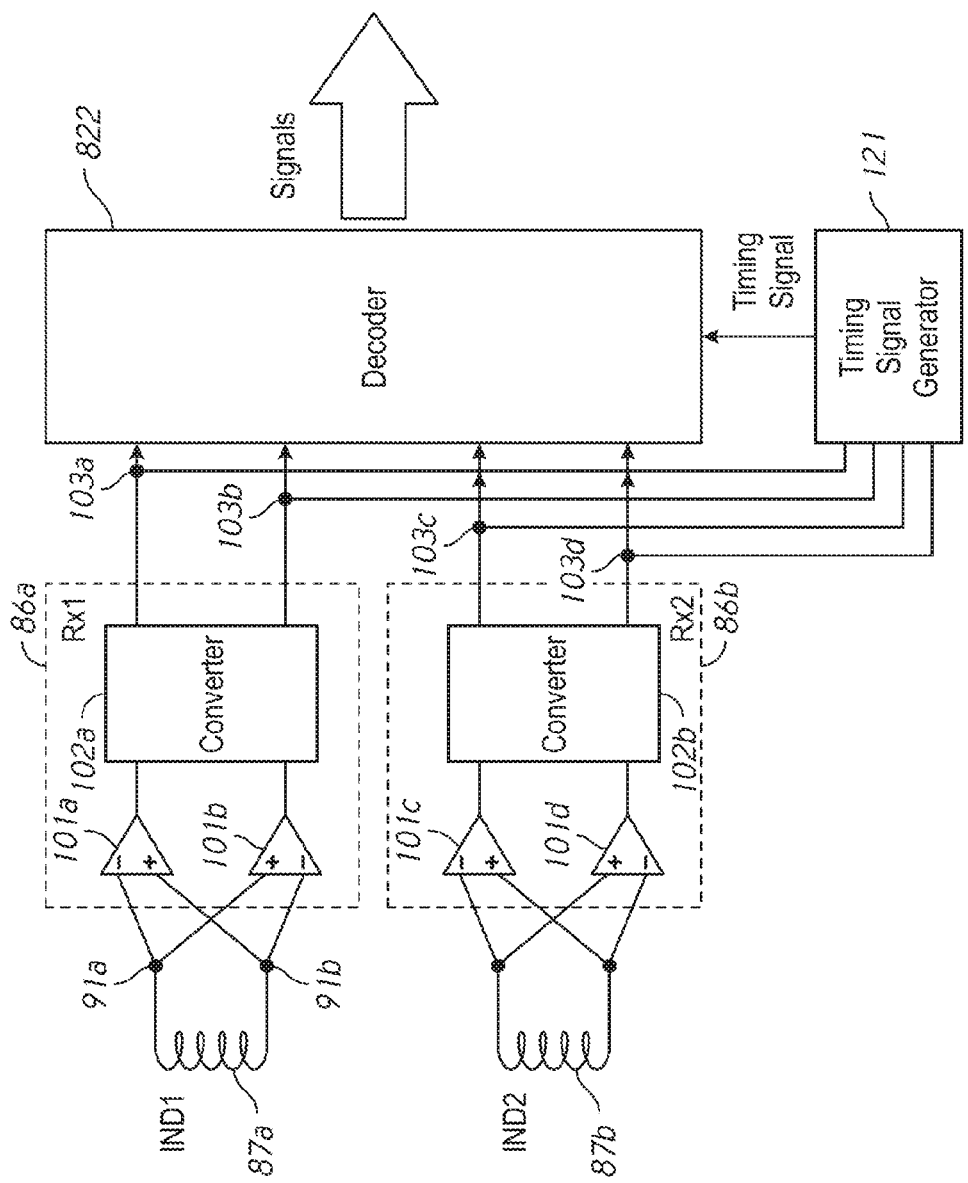
FIG. 12 is a block diagram of a portion of the semiconductor chip including a plurality of inductors and a plurality of receiver circuits in FIG. 8, according to an embodiment of the present disclosure.

FIG. 12 is a block diagram of a portion of the semiconductor chip including a plurality of receiver circuits in FIG. 8, according to an embodiment of the present disclosure. Description of components corresponding to components included in FIG. 10 will not be repeated and changes from FIG. 10, including a timing signal generator 121 on the semiconductor chip 80 will be described. For example, the timing signal generator 121 maybe an OR circuit that may receive the output signals on the pair of signal lines 103a and 103b from the converter 102a and output signals on a pair of signal lines 103c and 103d from the converter 102b. Thus, the timing signal generator 121 may generate a timing signal including falling edges responsive to all "0" signals on the signal lines 103a to 103d and rising edges responsive to the other combinations of signals on the signal lines 103a to 103d.

Figure 13:
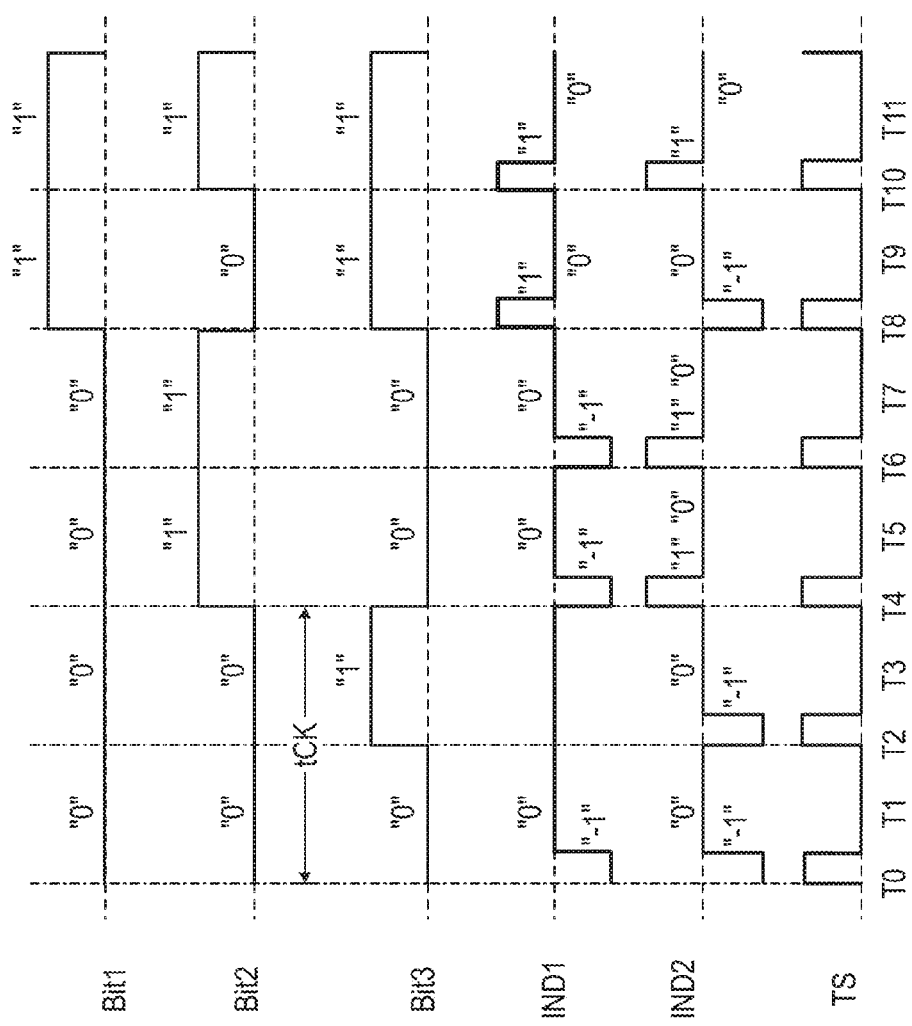
FIG. 13 is a timing diagram of the decoder circuit and the plurality of inductors in FIG. 12.

FIG. 13 is a timing diagram of the decoder circuit and the plurality of inductors in FIG. 12. The timing diagram in FIG. 13 uses translation tables of FIGS. 4A and 4B. At time T0, a combination of inductor states IND1 and IND2 is "−1, −1" to signal bit data Bit1, "0, 0, 0" and a timing signal TS takes a logic high level. At a time between time T0 and time T2, the combination of inductor states IND1 and IND2 is "0, 0" not assigned to any bit data, and the timing signal TS takes a logic low level. At time T2, the combination of inductor states IND1 and IND2 is "0, −1" to signal bit data Bit1, "0, 0, 1" and the timing signal TS takes the logic high level. At a time in an interval between time T2 and time T4, the combination of inductor states IND1 and IND2 is "0, 0", and the timing signal TS takes the logic low level. At time T4, the combination of inductor states IND1 and IND2 is "−1, 1" to signal bit data Bit1, "0, 1, 0" and the timing signal TS takes the logic high level. At a time in an interval between time T4 and time T6, the combination of inductor states IND1 and IND2 is "0, 0", and the timing signal TS takes the logic low level. At time T6, the combination of inductor states IND1 and IND2 is "−1, 1" to signal bit data Bit1, "0, 1, 0" and the timing signal TS takes the logic high level. At a time in an interval between time T6 and time T8, the combination of inductor states IND1 and IND2 is "0, 0", and the timing signal TS takes the logic low level. At time T8, the combination of inductor states IND1 and IND2 is "1, −1" to signal bit data Bit1, "1, 0, 1" and the timing signal TS takes the logic high level. At a time in an interval between time T8 and time T10, the combination of inductor states IND1 and IND2 is "0, 0" and the timing signal TS takes the logic low level. At time T10, the combination of inductor states IND1 and IND2 is "1, 1" to signal bit data Bit1, "1, 1, 1" and the timing signal TS takes the logic high level. At a time after T10, the combination of inductor states IND1 and IND2 is "0, 0", and the timing signal TS takes the logic low level. As observed, between the times T4 and T8, the combination of bit data Bit1, Bit2 and Bit3 "0, 1, 0" has been constant. Because the combination of the inductor states "0, 0" of the inductors IND1 and IND2 occurs at the times between T2 and T4, T4 and T6 and T6 and T8, a timing signal for the data at the times T4 and T6 in a sequence of the same data may be provided. As shown in FIG. 13, timings when the combination of inductor states IND1 and IND2 becomes "0, 0", and the timing signal TS takes the logic low level may be between T0 and T2, T2 and T4, T4 and T6, T6 and T8, and T8 and T10 to provide pulse widths of the IND2 sufficient for the receiver circuit 86a. Thus, the pulse width may be either shorter than a half of the clock cycle tCK, or the pulse width may be longer than the half of the clock cycle tCK.

Logic levels of signals used in the embodiments described the above are merely examples. However, in other embodiments, combinations of the logic levels of signals other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus for communicating a plurality of data bits, the apparatus comprising:
    a plurality of inductors configured to transmit data having a plurality of bits, the plurality of inductors comprising:
        a first inductor configured to, during a transmission, communicate using one of a first state, a second state, or a third state in response to first encoded signals, wherein, while in the first state, the first inductor is configured to increase a first current in a first direction, wherein, while in the second state, the first inductor is configured to increase the first current in a second direction opposite to the first direction, and wherein, while in the third state, the first inductor is configured to suppress the first current to a substantially zero level; and a second inductor configured to, during the transmission, communicate using one of a first state, a second state, or a third state in response to second encoded signals, wherein, while in the first state, the second inductor is configured to increase a second current in the first direction, wherein, while in the second state, wherein the second inductor is configured to increase the second current in the second direction, and wherein, while in the third state, the second inductor is configured to suppress the second current to a substantially zero level, and an encoder configured to receive the plurality of data bits, and further configured to encode the first encoded signals and the second encoded signals based on the plurality of data bits.

2. The apparatus of claim 1, wherein the first inductor and the second inductor are adjacent to each other;
wherein a combination of the first state of one of the first and second inductors and the second state of the other of the first and second inductors simultaneously is prohibited.

3. The apparatus of claim 1, wherein at least one of the first inductor and the second inductor is in the first state or the second state responsive to the encoded signals.

4. The apparatus of claim 1, wherein the number of the plurality of data bits is equal to or greater than a number of the plurality of inductors.

5. The apparatus of claim 1, further comprising:
a second set of inductors comprising:
a third inductor in proximity to the first inductor having a first voltage configured to be induced by a first electromotive force induced by the first current; and
a fourth inductor in proximity to the second inductor having a second voltage configured to be induced by a second electromotive force caused by the second current.

6. The apparatus of claim 5, further comprising:
a decoder configure to receive data responsive to states of the second set of inductors, and further configured to decode the data to the plurality of data bits,
wherein the states of the second set of inductors include the first voltage and the second voltage.

7. A method of transmitting data, comprising:
encoding a plurality of binary data bits for transmission into a combination of three current states of a plurality of inductors in a first semiconductor chip,
wherein the three current states include:
a first current state represented by a current change in a first direction;
a second current state represented by a current change in a second direction; and
a third current state represented by no current change,
wherein encoding the plurality of binary data bits into the combination of three current states of the plurality of inductors in the first semiconductor chip comprises,
controlling a current state of a first inductor of the plurality of inductors based on the plurality of binary data bits; and
controlling a current state of a second inductor of the plurality of inductors based on the plurality of binary data bits, wherein a combination of controlling the first inductor in the first current state and controlling the second inductor in the second current state is prohibited.

8. The method of claim 7, wherein a number of the plurality of binary data bits is equal to or greater than a number of the plurality of inductors.

9. The method of claim 7, wherein at least one of the first inductor and the second inductor is in the first current state or the second current state responsive to a first one of the plurality of binary data,
wherein the at least one of the first inductor and the second inductor is in the first current state or the second current state responsive to a second one of the plurality of binary data following to the first one of the plurality of data, and
wherein the first inductor and the second inductor are in the third current state simultaneously at a time in an interval between the first one of the plurality of data and the second one of the plurality of data.

10. The method of claim 7, further comprising:
inducing a first voltage at a third inductor in a second semiconductor chip responsive to the current state of the first inductor;
inducing a second voltage at a fourth inductor in the second semiconductor chip responsive to the current state of the second inductor; and
decoding a combination of the first voltage and the second voltage into the plurality of data bits.

11. The method of claim 10, wherein the third inductor is in proximity to the first inductor, and wherein the fourth inductor is in proximity to the second inductor.

* * * * *

UNITED STATES PATENT AND TRADEMARK OFFICE
CERTIFICATE OF CORRECTION

PATENT NO. : 10,027,381 B2  
APPLICATION NO. : 15/221346  
DATED : July 17, 2018  
INVENTOR(S) : Ken Iwakura Page 1 of 1

It is certified that error appears in the above-identified patent and that said Letters Patent is hereby corrected as shown below:

In the Claims

| | Reads | Should Read |
|---|---|---|
| Column 11, Line 15 | "wherein the second inductor" | --the second inductor-- |
| Column 11, Line 47 | "a decoder configure to" | --a decoder configured to-- |

Signed and Sealed this  
Eleventh Day of June, 2019

Andrei Iancu  
*Director of the United States Patent and Trademark Office*